(12) United States Patent
Kang

(10) Patent No.: US 11,837,553 B2
(45) Date of Patent: Dec. 5, 2023

(54) SEMICONDUCTOR PACKAGE

(71) Applicant: SAMSUNG ELECTRONICS CO., LTD., Suwon-si (KR)

(72) Inventor: Junghoon Kang, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 17/405,696

(22) Filed: Aug. 18, 2021

(65) Prior Publication Data

US 2022/0165634 A1   May 26, 2022

(30) Foreign Application Priority Data

Nov. 24, 2020 (KR) .......................... 10-2020-0159234

(51) Int. Cl.
| | | |
|---|---|---|
| H01L 23/538 | (2006.01) | |
| H01L 23/544 | (2006.01) | |
| H01L 23/31 | (2006.01) | |
| H01L 25/065 | (2023.01) | |
| H01L 23/00 | (2006.01) | |

(52) U.S. Cl.
CPC ........ H01L 23/544 (2013.01); H01L 23/3121 (2013.01); H01L 23/5384 (2013.01); H01L 23/5386 (2013.01); H01L 24/16 (2013.01); H01L 25/0657 (2013.01); H01L 2224/16225 (2013.01); H01L 2225/06517 (2013.01)

(58) Field of Classification Search
CPC . H01L 25/0657; H01L 25/043; H01L 25/074; H01L 25/0756; H01L 25/117; H01L 2224/08145; H01L 23/528–5283; H01L 23/544; H01L 2223/54426; B81C 99/007

See application file for complete search history.

(56) References Cited

U.S. PATENT DOCUMENTS

| | | | |
|---|---|---|---|
| 6,248,973 B1 | 6/2001 | Matsumura et al. | |
| 7,842,543 B2 | 11/2010 | Wu et al. | |
| 8,557,715 B2 | 10/2013 | Chung et al. | |
| 9,266,350 B2 | 2/2016 | Lazzari et al. | |
| 9,355,965 B2 | 5/2016 | Sik et al. | |
| 10,300,732 B2 | 5/2019 | Yamada | |
| 2015/0380359 A1* | 12/2015 | Lim ...................... | H01L 23/544 |
| | | | 257/773 |
| 2019/0051619 A1* | 2/2019 | Kim .................... | H01L 23/5386 |

(Continued)

FOREIGN PATENT DOCUMENTS

KR   10-2009-0083791 A   8/2009

*Primary Examiner* — Younes Boulghassoul
*Assistant Examiner* — Quinton A Brasfield
(74) *Attorney, Agent, or Firm* — Sughrue Mion, PLLC

(57) ABSTRACT

A semiconductor package includes a first semiconductor chip; an encapsulant covering at least a portion of the first semiconductor chip; insulating layers provided on the encapsulant, each of the insulating layers being transparent or translucent; and wiring layers provided on the encapsulant, the wiring layers being partially covered by the insulating layers, wherein an outermost insulating layer of the insulating layers comprises a first region and a second region, a color of the first region is different from a color of the second region, the second region surrounds the first region, and at least one marking pattern comprising at least one step portion is provided in the first region of the outermost insulating layer.

20 Claims, 13 Drawing Sheets

(56) References Cited

U.S. PATENT DOCUMENTS

2020/0105679 A1* 4/2020 Bae .................. H01L 24/09
2020/0111742 A1* 4/2020 Han .................. H01L 24/17
2020/0273806 A1* 8/2020 Chiang ............... H01L 23/5389

* cited by examiner

SEMICONDUCTOR PACKAGE

CROSS-REFERENCE TO RELATED APPLICATION(S)

This application claims priority under 35 USC § 119(a) to Korean Patent Application No. 10-2020-0159234 filed on Nov. 24, 2020 in the Korean Intellectual Property Office, the disclosure of which is incorporated by reference herein in its entirety.

BACKGROUND

The present disclosure relates to a semiconductor package.

In semiconductor package manufacturing processes, marking processes are performed on respective semiconductor packages, in which various pieces of information such as product manufacturing companies and manufacturing dates, product names and product types are imprinted on respective semiconductor packages. There is a need for a marking method in which the visibility of a marking pattern engraved on a semiconductor package may be improved.

SUMMARY

One or more example embodiments provide a semiconductor package including a marking pattern having improved visibility.

In accordance with an aspect of an example embodiment, there is provided a semiconductor package including: a first semiconductor chip; an encapsulant covering at least a portion of the first semiconductor chip; insulating layers provided on the encapsulant, each of the insulating layers being transparent or translucent; and wiring layers provided on the encapsulant, the wiring layers being partially covered by the insulating layers, wherein an outermost insulating layer of the insulating layers comprises a first region and a second region, a color of the first region is different from a color of the second region, the second region surrounds the first region, and at least one marking pattern comprising at least one step portion is provided in the first region of the outermost insulating layer.

In accordance with an aspect of an example embodiment, there is provided a semiconductor package including: a frame having a through-hole and including a wiring structure connecting a first surface of the frame to a second surface of the frame opposite to the first surface; a first connection structure provided on the second surface of the frame, the first connection structure including first redistribution layers electrically connected to the wiring structure and first insulating layers covering a portion of the first redistribution layers; a semiconductor chip provided on the first connection structure in the through-hole, the semiconductor chip including a connection pad electrically connected to a first redistribution layer of the first redistribution layers; an encapsulant encapsulating the semiconductor chip and extending to cover the first surface of the frame; and a second connection structure provided on the first surface of the frame and the encapsulant, the second connection structure including second redistribution layers electrically connected to the wiring structure and second insulating layers covering a portion of the second redistribution layers, wherein each of the second insulating layers includes a photoimageable dielectric material layer, an outermost second insulating layer of the second insulating layers includes a first region and a second region, a color of the first region is different from a color of the second region, the second region surrounds the first region, and at least one marking pattern including at least one step portion is provided in the first region of the outermost second insulating layer.

In accordance with an aspect of an example embodiment, there is provided a semiconductor package including: a semiconductor chip; an encapsulant covering at least a portion of the semiconductor chip; an insulating layer provided on the encapsulant, the insulating layer being transparent or translucent; and a wiring layer provided between the semiconductor chip and the insulating layer, wherein the insulating layer includes a first region and a second region, a visible light transmittance of the first region is different from a visible light transmittance of the second region, the second region surrounds the first region, the first region includes a portion overlapping the wiring layer in a vertical direction, and at least one marking pattern including at least one step portion is provided in the first region of the insulating layer.

In accordance with an aspect of an example embodiment, there is provided, a method of manufacturing a semiconductor package, the method including: forming a first connection structure including a first insulating layer and a first redistribution layer on a first surface of a semiconductor chip; forming a second connection structure including at least one second insulating layer and a second redistribution layer on a second surface of the semiconductor chip; forming a discolored area by performing a laser annealing process on a surface of an outermost second insulating layer of the at least one second insulating layer; and forming a marking pattern including a step portion by performing a laser marking process on a surface of the outermost second insulating layer within the discolored area, the at least one second insulating layer includes a transparent or translucent photoimageable dielectric material, and the discolored area is formed by performing the laser annealing process to change a color of a region of the outermost second insulating layer.

BRIEF DESCRIPTION OF DRAWINGS

The above and other aspects, features, and advantages of certain embodiments of the disclosure will be more apparent from the following description, taken in conjunction with the accompanying drawings, in which.

DETAILED DESCRIPTION

Hereinafter, example embodiments will be described with reference to the accompanying drawings.

Figure 1:
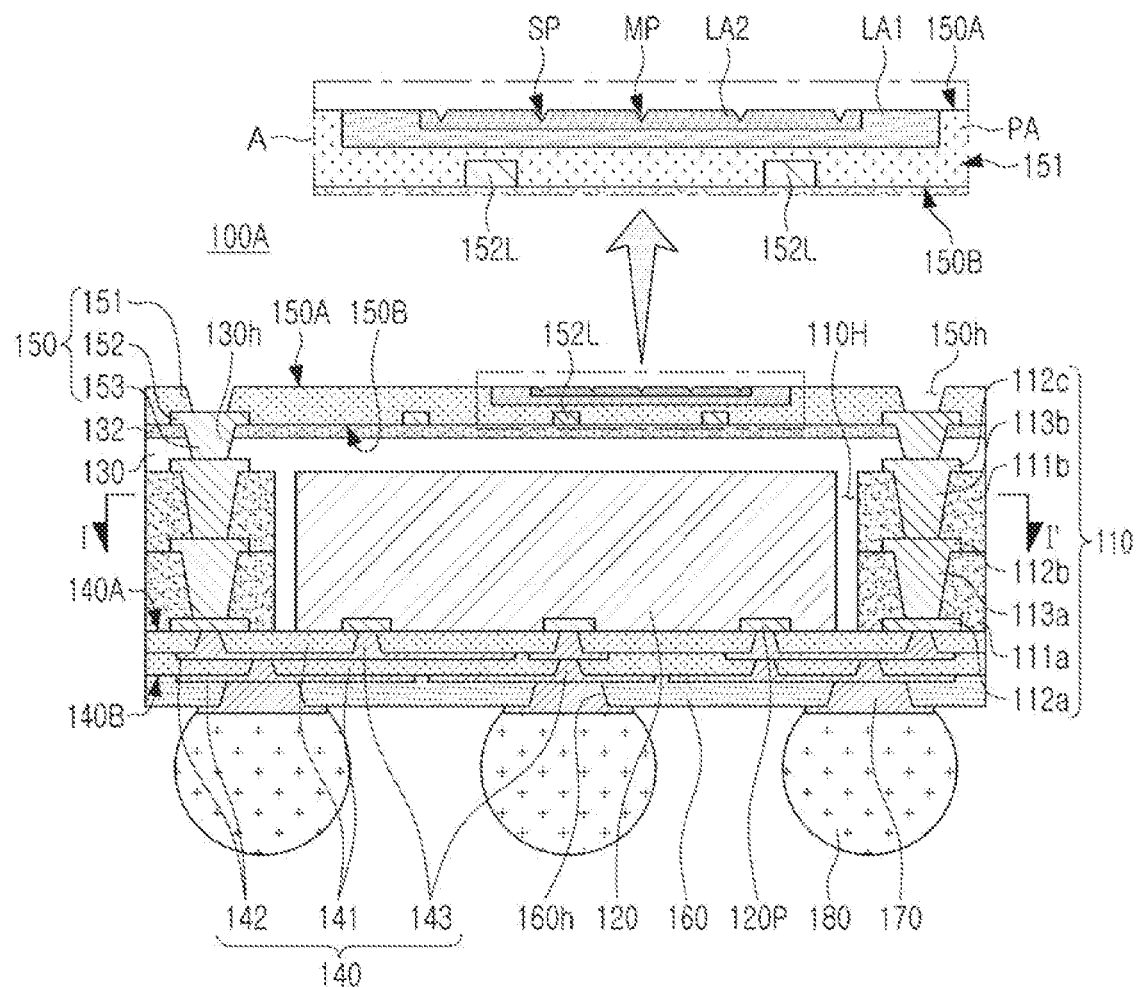
FIG. 1 is a cross-sectional view illustrating a semiconductor package according to example embodiments.

FIG. 1 is a cross-sectional view illustrating a semiconductor package according to example embodiments.

Figure 2:
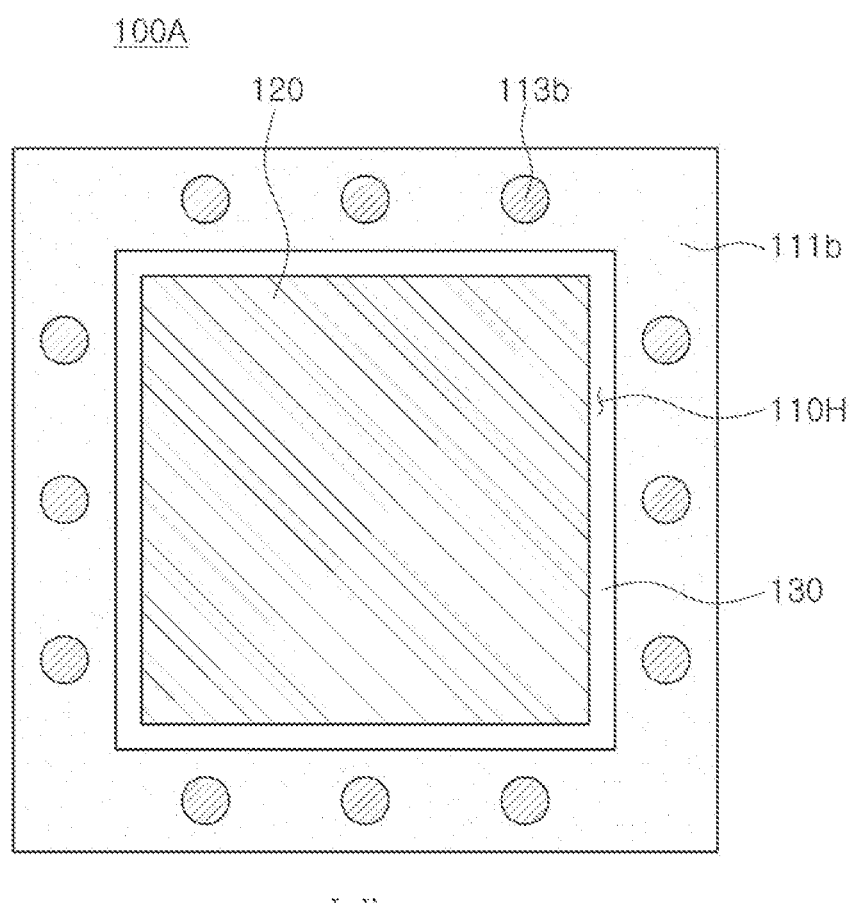
FIG. 2 is a plan view illustrating a semiconductor package according to example embodiments.

FIG. 2 is a cross-sectional plan view of the semiconductor package of FIG. 1 taken along a line I-I'.

Figure 3:
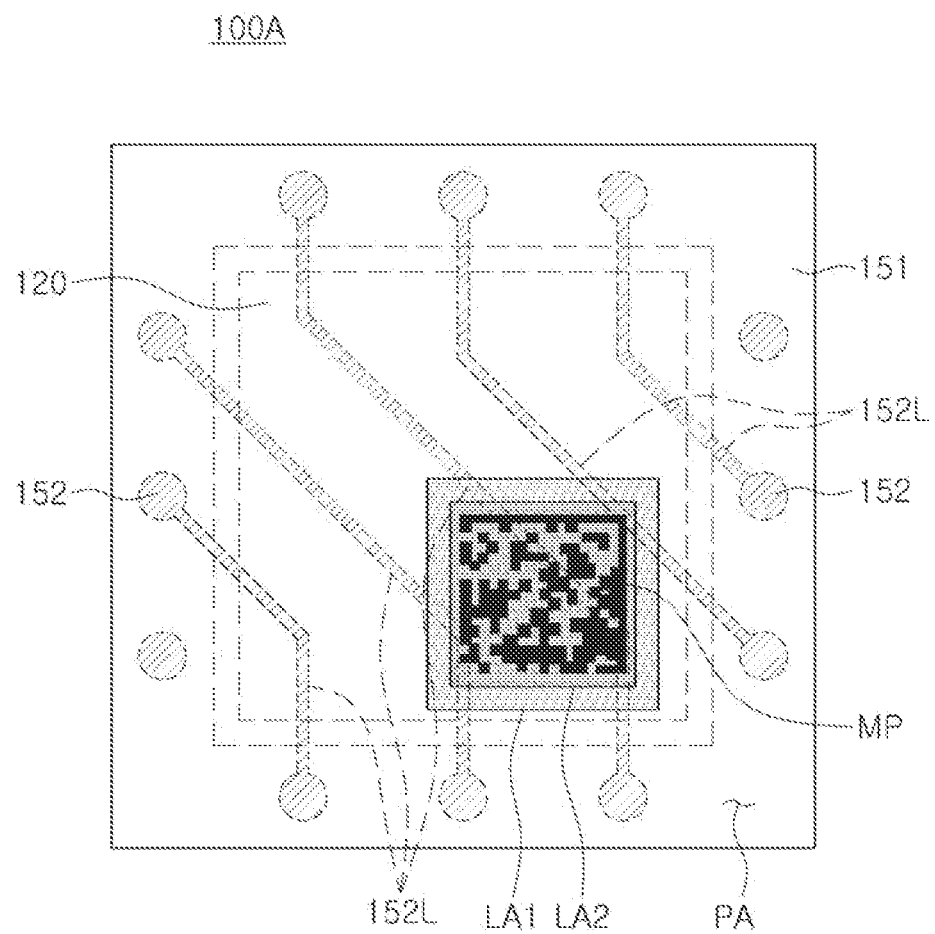
FIG. 3 is a plan view illustrating a region of a semiconductor package including a marking pattern according to example embodiments.

FIG. 3 is a plan view illustrating a region of a semiconductor package including a marking pattern according to example embodiments. FIG. 3 is a plan view of the semiconductor package of FIG. 1 viewed from above.

Referring to FIGS. 1 to 3, a semiconductor package 100A according to example embodiments may include a frame 110 having a through-hole 110H, a semiconductor chip 120 disposed in the through-hole 110H, an encapsulant 130 sealing the semiconductor chip 120, a first connection structure 140 disposed below the semiconductor chip 120 and having a first surface 140A and a second surface 140B opposing each other, and a second connection structure 150 disposed on the semiconductor chip 120 and having a first surface 150A and a second surface 150B opposing each other. The semiconductor package 100A may further include a passivation layer 160, an underbump metal layer 170, and a metal bump 180. A discolored area LA1, a marking area LA2, and a marking pattern MP may be disposed in the first surface 150A of the second connection structure 150.

The frame 110 may be disposed on the first surface 140A of the first connection structure 140, and the semiconductor chip 120 may be disposed or accommodated in the through-hole 110H, in such a manner that the surface of the semiconductor chip 120 on which a connection pad 120P is disposed (i.e., the lower surface of the semiconductor chip 120) faces the first surface 140A of the first connection structure 140. The frame 110 may include a wiring structure having first to third wiring layers 112a, 112b, and 112c (i.e., frame wiring layers) and first and second wiring via layers 113a and 113b. The wiring structure may connect the first surface to the second surface of the frame 110 opposite to the first surface. The frame 110 may include a first core insulating layer 111a in contact with the first surface 140A of the first connection structure 140, and a second core insulating layer 111b on the first core insulating layer 111a. The first core insulating layer 111a may cover at least a portion of the first wiring layer 112a, and the second core insulating layer 111b may cover at least a portion of the second wiring layer 112b. The first wiring via layer 113a penetrates through the first core insulating layer 111a to electrically connect the first wiring layer 112a to the second wiring layer 112b, and the second wiring via layer 113b penetrates through the second core insulating layer 111b to electrically connect the second wiring layer 112b to the third wiring layer 112c.

The first and second core insulating layers 111a and 111b may respectively include an insulating material, and examples of the insulating material may include a thermosetting resin such as epoxy resin, a thermoplastic resin such as polyimide, or an insulating material in which these resins are impregnated in a core material such as an inorganic filler and/or glass fibers (Glass Fiber, Glass Cloth, Glass Fabric), for example, prepreg, Ajinomoto Build-up Film (ABF), FR-4, Bismaleimide Triazine (BT), or the like.

The first to third wiring layers 112a, 112b, and 112c may serve to redistribute the connection pads 120P of the first semiconductor chip 120, and may serve to provide pad patterns for the first and second wiring via layers 113a and 113b for upper/lower connection of the semiconductor package 100A. The first to third wiring layers 112a, 112b, and 112c may include a metal material such as copper (Cu), aluminum (Al), silver (Ag), tin (Sn), gold (Au), nickel (Ni), lead (Pb), and titanium (Ti), or alloys thereof. The first to third wiring layers 112a, 112b, and 112c may perform various functions according to the design of the corresponding layer. For example, the first to third wiring layers 112a, 112b, and 112c may include a ground pattern, a power pattern, a signal pattern, and the like. In this case, the signal pattern may include various signals, for example, data signals, excluding the ground pattern and the power pattern related to power, and the like.

The first and second wiring via layers 113a and 113b may electrically connect the first to third wiring layers 112a, 112b, and 112c formed on different layers, and as a result, may form an electrical path in the frame 110. The first and second wiring via layers 113a and 113b may include a metallic material. The first and second wiring via layers 113a and 113b may respectively be a filled via completely filled with a metal material, or a conformal via formed along a wall surface of the via hole. In addition, the first and second wiring via layers 113a and 113b may respectively have a tapered shape. On the other hand, the first and second wiring via layers 113a and 113b may be integrated with at least a portion of the first to third wiring layers 112a, 112b, and 112c, but the configurations are not limited thereto.

The semiconductor chip 120 may be disposed on the first surface 140A of the first connection structure 140 and may include one or more connection pads 120P electrically connected to the first redistribution layer 142 of the first connection structure 140. The connection pad(s) 120P may include, for example, a metal material such as aluminum (Al) or the like. The semiconductor chip 120 may be a logic chip or a memory chip. The logic chip may include, for example, a central processing unit (CPU), a graphics processing unit (GPU), a field programmable gate array (FPGA), a digital signal processor (DSP), an encryption processor, a microprocessor, a microcontroller, an analog-digital converter, an application-specific integrated circuit (ASIC), and the like. The memory chip may include, for example, a volatile memory device such as a dynamic random access memory (DRAM) or static RAM (SRAM), or a non-volatile memory device such as a phase change RAM (PRAM), magnetic RAM (MRAM), resistive RAM (RRAM), or flash memory. In an example embodiment, the semiconductor chip 120 may be mounted on the first connection structure 140 in a wire bonding method.

The encapsulant 130 is disposed on the first surface 140A of the first connection structure 140 and may cover at least a portion of the semiconductor chip 120. The encapsulant 130 may include an insulating material, for example, a thermosetting resin such as epoxy resin, a thermoplastic resin such as polyimide, or prepreg, Ajinomoto Build-up Film (ABF), FR-4, Bismaleimide Triazine (BT), Epoxy Molding Compound (EMC) or the like including an inorganic filler and/or glass fiber.

The first connection structure 140 may include a first redistribution structure having a first redistribution layer 142 and a first redistribution via 143, and the second connection structure 150 may include a second redistribution structure having a second redistribution layer 152 and a second redistribution via 153. The second redistribution layer 152 may include a circuit line 152L disposed on the semiconductor chip 120. The circuit line 152L may be a portion of the second redistribution layer 152 disposed between the encapsulant 130 and a second insulating layer 151. The first connection structure 140 may be disposed on the second surface of the frame 110. The second connection structure 150 may be disposed on the first surface of the frame 110 and the encapsulant 130. The first connection structure 140 may include a first insulating layer 141 filling at least a portion of the first redistribution layer 142, and the second connection structure 150 may include a second insulating layer 151 filling at least a portion of the second redistribution layer 152. The first and second insulating layers 141 and 151, the first and second redistribution layers 142 and 152, and the first and second redistribution vias 143 and 153 of the first and second connection structures 140 and 150 may be formed of more or fewer layers than those illustrated in the drawings. The first connection structure 140 may redistribute the connection pads 120P of the first semiconductor chip 120. In addition, the first connection structure 140 may electrically connect the connection pad 120P to the wiring layers 112a, 112b, and 112c of the frame 110, respectively, according to a function. The first and second redistribution structures of the first and second connection structures 140 and 150 may be electrically connected to each other.

The first and second insulating layers 141 and 151 may include an insulating material. In addition to the above-described insulating material, the insulating material may be a photoimageable dielectric material such as a photoimageable dielectric (PID) resin. For example, the first and second insulating layers 141 and 151 may each include a photoimageable dielectric material layer. Each of the first and second insulating layers 141 and 151 may include a photoimageable dielectric material layer including an insulating resin and an inorganic filler. The first and second insulating layers 141 and 151 may be respectively a transparent or translucent insulating layer, and may not include carbides such as carbon black. For example, the first and second insulating layers 141 and 151 may be formed of a thermosetting material layer or a photoimageable dielectric material layer. When the first and second insulating layers 141 and 151 each have a structure of multiple layers, materials in each layer thereof may be the same as or different from each other. When each of the first and second insulating layers 141 and 151 has the structure of multiple layers, the multiple layers may be integrated according to a process, and the boundary therebetween may be unclear by themselves, but the configuration is not limited thereto. The second insulating layer 151 may include openings 150h exposing a portion of the second redistribution layer 152 in a peripheral area PA, and the openings 150h may not be disposed in the discolored area LA1 and may not be disposed in the marking area LA2.

The first redistribution layer 142 may serve to substantially redistribute the connection pad 120P. The first redistribution layer 142 may be electrically connected to the connection pad 120P and the wiring layers 112a, 112b, and 112c, and the second redistribution layer 152 may be electrically connected to the wiring layers 112a, 112b, and 112c. The first and second redistribution layers 142 and 152 may respectively include a metal material such as copper (Cu), aluminum (Al), silver (Ag), tin (Sn), gold (Au), nickel (Ni), lead (Pb), and titanium (Ti), alloys thereof, or the like. The first and second redistribution layers 142 and 152 may perform various functions according to the design of the corresponding layer. For example, the first and second redistribution layers 142 and 152 may include a ground pattern, a power pattern, a signal pattern, and the like. The signal pattern may include various signals, for example, data signals, excluding the ground pattern, the power pattern, and the like. In this case, the pattern may include wirings and pads. The second redistribution layer 152 is a circuit pattern disposed on the semiconductor chip 120 and may also be referred to as a wiring layer.

The first redistribution via 143 may electrically connect the first redistribution layers 142 formed at different levels, and may electrically connect the connection pad 120P of the semiconductor chip 120 to the first redistribution layer 142. The second redistribution via 153 may electrically connect an uppermost third wiring layer 112c to the second redistribution layer 152. The first and second redistribution vias 143 and 153 may respectively include a metal material such as copper (Cu), aluminum (Al), silver (Ag), tin (Sn), gold (Au), nickel (Ni), lead (Pb), titanium (Ti), or alloys thereof. The first and second redistribution vias 143 and 153 may be a filled-type filled with a metal material, or may be a conformal type in which a metal material is formed along a wall surface of the via hole. The first and second redistribution vias 143 and 153 may have a tapered cross-sectional shape. The taper directions may be opposite to each other in the first and second redistribution vias 143 and 153, and the taper direction of the first redistribution via 143 may be opposite to the taper direction of the wiring via layers 113a and 113b of the frame 110.

As illustrated in FIGS. 1 and 3, the semiconductor package 100A may include marking patterns MP disposed on the surface of an outermost second insulating layer 151. The marking patterns MP may indicate identification information. In this case, the identification information may include various pieces of information having traceability of the corresponding semiconductor package, for example, a process number, a manufacturing company, a manufacturing date, a product name, a product type, and a combination thereof. In addition, the marking patterns MP may include not only symbols, numbers, and characters, but also a 2D barcode including a lot of information in a relatively small area. For example, the 2D barcode may be implemented in various types such as a data matrix, a QR code and the like.

The second insulating layer 151 of the second connection structure 150 may include a transparent or translucent insulating material, and thus, the second redistribution layers 152 and 152L embedded in the second insulating layer 151 may be visible therethrough. For example, the second insulating layer 151 may include a thermosetting resin or a photoimageable dielectric resin. In the case in which the second insulating layer 151 contains carbon black, the level difference of the marking pattern MP may be clearly seen, but in the case of the transparent or translucent second insulating layer 151, since the second redistribution layers 152 and 152L are visible through the transparent or translucent second insulating layer 151, it may be difficult to secure the visibility of the marking pattern MP. According to an example embodiment, visibility of the marking pattern MP formed on the second insulating layer 151 may be secured as described below.

When the semiconductor package 100A is viewed from the top, the second insulating layer 151 may include the discolored area LA1 and the marking area LA2 having different optical properties, for example, different colors. In this case, the meaning of different colors may indicate that the configurations are different in at least one of hue, brightness, and saturation. The discolored area LA1 may have a shape surrounding the marking area LA2, and the peripheral area PA of the second insulating layer 151 other than the discolored area LA1 may have a shape surrounding the discolored area LA1. The peripheral area PA may have a different color from the discolored area LA1, and may be transparent or translucent. The marking area LA2 may have an area smaller than that of the discolored area LA1. The peripheral area PA, the discolored area LA1, and the marking area LA2 may be distinguished from each other due to optical properties thereof, for example, different colors, or due to different visible light transmittances. For example, the visible light transmittance of the discolored area LA1 may be lower than the visible light transmittance of the peripheral area PA, and the visible light transmittance of the marking area LA2 may be lower than the visible light transmittance of the discolored area LA1. Accordingly, when the semiconductor package 100A is viewed from above with the naked eye or an optical microscope, the boundary or edge of the peripheral area PA, the discolored area LA1, and the marking area LA2 may be clearly distinguished. The discolored area LA1 may be referred to as a 'first region', the peripheral area PA may be referred to as a 'second region', and the marking area LA2 may be referred to as a 'third region', but the configuration is not limited thereto.

The discolored area LA1 may at least partially overlap the semiconductor chip 120 in a vertical direction. The discolored area LA1 may include a portion overlapping the second redistribution layer 152 including the circuit line 152L in a vertical direction. The marking pattern MP may include a portion overlapping the second redistribution layer 152 including the circuit line 152L in a vertical direction.

The marking pattern MP may be disposed in the marking area LA2. As illustrated in the enlarged view of FIG. 1, since the marking pattern MP includes one or more step portions SP, the pattern may be clearly recognized by the difference in contrast. When the second insulating layer 151 is formed of a transparent or semi-transparent material, even when the marking pattern MP includes a step portion SP, the second redistribution layers 152 and 152L below the marking pattern MP are visible, and thus, it may be difficult to secure the visibility of the marking pattern MP. According to an example embodiment, the marking pattern MP is disposed within the discolored area LA1, for example, in the marking area LA2, and the transparency of the second redistribution layers 152 and 152L may be reduced by the discolored area LA1 and the marking area LA2, and visibility of the marking pattern MP may be improved. For example, reducing the transparency of a layer may mean that the degree to which the layer is clearly visible above the transparent layer is decreased by reducing the transparency of a portion of the transparent or translucent layer. In detail, when the second redistribution layers 152 and 152L are implemented as a fine circuit pattern on the semiconductor chip 120, the visibility of the marking pattern MP may further be improved by the discolored area LA1 and the marking area LA2.

For example, when the marking pattern MP is a two-dimensional barcode, the identification process may obtain required identification information by irradiating light onto the marking pattern MP and converting the irradiated light into a digital signal, based on the difference in the amount of reflection. In this case, by significantly reducing the effect of the second redistribution layers 152 and 152L on the amount of light reflection, visibility of the marking pattern MP may be secured. Even when the marking pattern MP is provided with numbers, symbols, or the like, visibility of the marking pattern MP is secured by significantly reducing transparency of the second redistribution layers 152 and 152L.

The discolored area LA1 may be formed by performing a laser annealing process on a partial area of the second insulating layer 151 to partially change the physical properties of a material layer forming the second insulating layer 151. For example, the polycrystalline ratio of an insulating material layer in the discolored area LA1 may be higher than the polycrystalline ratio of an insulating material layer in the peripheral area PA. For example, the insulating material layer in the discolored area LA1 may be in a further hardened state than the insulating material layer in the peripheral area PA. However, carbon black may not be formed in the discolored area LA1. In addition, the polycrystalline ratio of an insulating material layer in the marking area LA2 may be higher than the polycrystalline ratio of the insulating material layer in the discolored area LA1. The marking area LA2 may also be formed by performing a laser annealing process on a partial area of the second insulating layer 151.

The passivation layer 160 may be provided as a layer for protecting the semiconductor package from external physical and chemical damage. The passivation layer 160 may protect the first connection structure 140. The passivation layer 160 may have an opening 160h exposing at least a portion of a lowermost first redistribution layer 142. The passivation layer 160 may include an insulating resin and an inorganic filler, but may not include glass fibers. For example, the passivation layer 160 may include ABF, but the material thereof is not limited thereto, and may be a photoimageable dielectric material (PID).

The underbump metal layer 170 may be disposed on the metal bump 180 to improve connection reliability of the metal bump 180. For example, the underbump metal layer 170 may improve board-level reliability of the semiconductor package 100A according to an example embodiment. As the underbump metal layer 170, tens to tens of thousands of underbump metal layers 170 may be used. The respective underbump metal layers 170 may be connected to the first redistribution layer 142 through the opening 160h penetrating through the passivation layer 160.

The metal bump 180 may be a configuration for physically and/or electrically connecting the semiconductor package 100A externally. For example, the semiconductor package 100A may be mounted on a main board of an electronic device through the metal bump 180. The metal bump 180 may include a low melting point metal, for example, tin (Sn) or an alloy containing tin (Sn) (e.g., Sn—Ag—Cu). The metal bump 180 may include, for example, a solder ball. The metal bump 180 may have a land, a ball, or a pin shape. The metal bump 180 may be formed in multiple layers or a single layer. When formed in multiple layers, the metal bump 180 may include a copper pillar and solder, and when formed in a single layer, the metal bump 180 may include tin-silver solder or copper.

Figure 4:
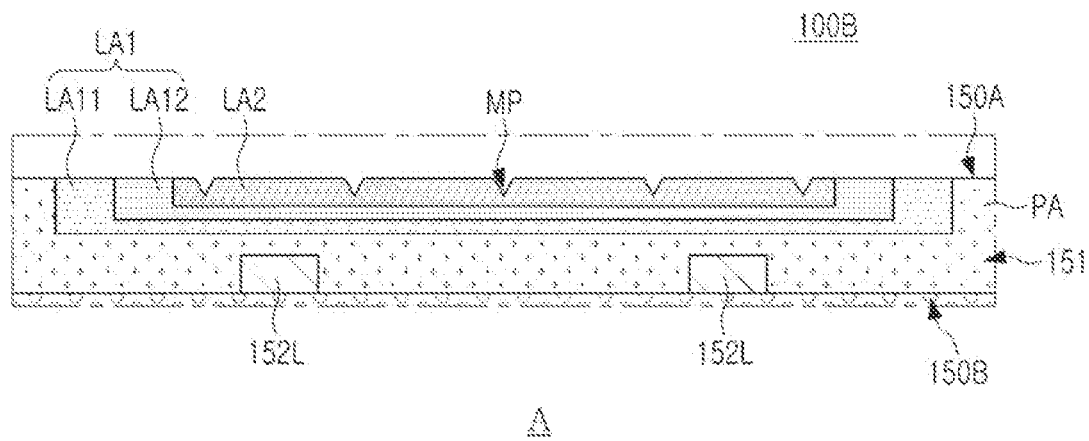
FIG. 4 is a partially enlarged cross-sectional view illustrating a region of a semiconductor package including a marking pattern according to example embodiments.

FIG. 4 is a partially enlarged cross-sectional view of a semiconductor package according to example embodiments. FIG. 4 is an enlarged view of an area corresponding to area "A" of FIG. 1.

Referring to FIG. 4, a second insulating layer 151 of a semiconductor package 100B may include a first discolored area LA11, a second discolored area LA12, and a marking area LA2. The first discolored area LA11 may be surrounded by a peripheral area PA, and the second discolored area LA12 may be surrounded by the first discolored area LA11. The second discolored area LA12 may surround the marking area LA2. The peripheral area PA, the first and second discolored areas LA11 and LA12, and the marking area LA2 may have different colors, and boundaries and edges thereof may be clearly distinguished due to different visible light transmittances. For example, the visible light transmittance of the first discolored area LA11 may be lower than that of the peripheral area PA, the visible light transmittance of the second discolored area LA12 may be lower than the visible light transmittance of the first discolored area LA11, and the visible light transmittance of the marking area LA2 may be lower than the visible light transmittance of the second discolored area LA12. A discolored area LA1 constituting the first and second discolored areas LA11 and LA12 may be an area formed by a laser annealing process. For example, a first annealing process is performed on a partial area of the second insulating layer 151 to form the first discolored area LA11, and a second annealing process is formed in an area smaller than the first discolored area LA11 to form the second discolored area LA12.

Figure 5:
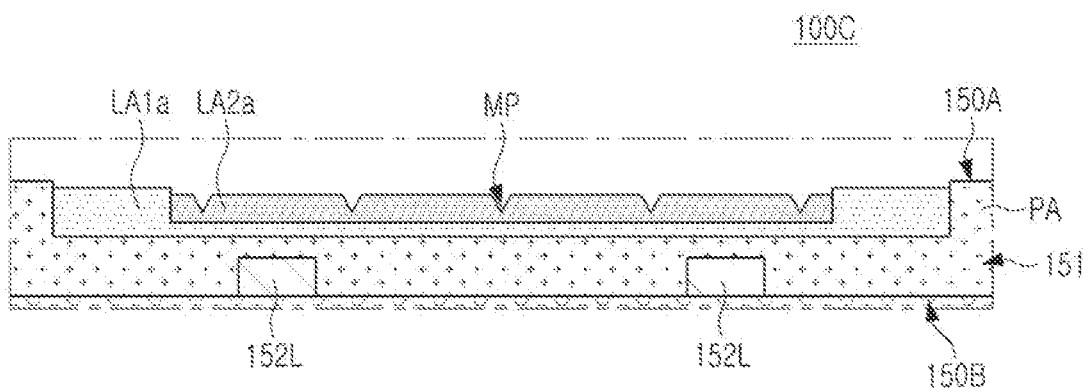
FIG. 5 is a partially enlarged cross-sectional view illustrating a region of a semiconductor package including a marking pattern according to example embodiments.

FIG. 5 is a partially enlarged cross-sectional view of a semiconductor package according to example embodiments. FIG. 5 illustrates an enlarged view of an area corresponding to area "A" of FIG. 1.

Referring to FIG. 5, in a second insulating layer 151 of a semiconductor package 100C, the height levels of the upper surfaces of a peripheral area PA, a discolored area LA1a, and a marking area LA2a may be different from those of the previous embodiment. For example, the upper surface of the discolored area LA1a may be located at a level lower than the upper surface of the peripheral area PA, and the upper surface of the marking area LA2a may be located at a level lower than the upper surface of the discolored area LA1a. The reduction in the heights of the upper surfaces of the discolored area LA1a and the marking area LA2a may be formed by performing a laser annealing process and a laser marking process such that the second insulating layer 151 is recessed from the upper portion to a predetermined depth in the regions corresponding to the discolored area LA1a and the marking area LA2a.

Figure 6:
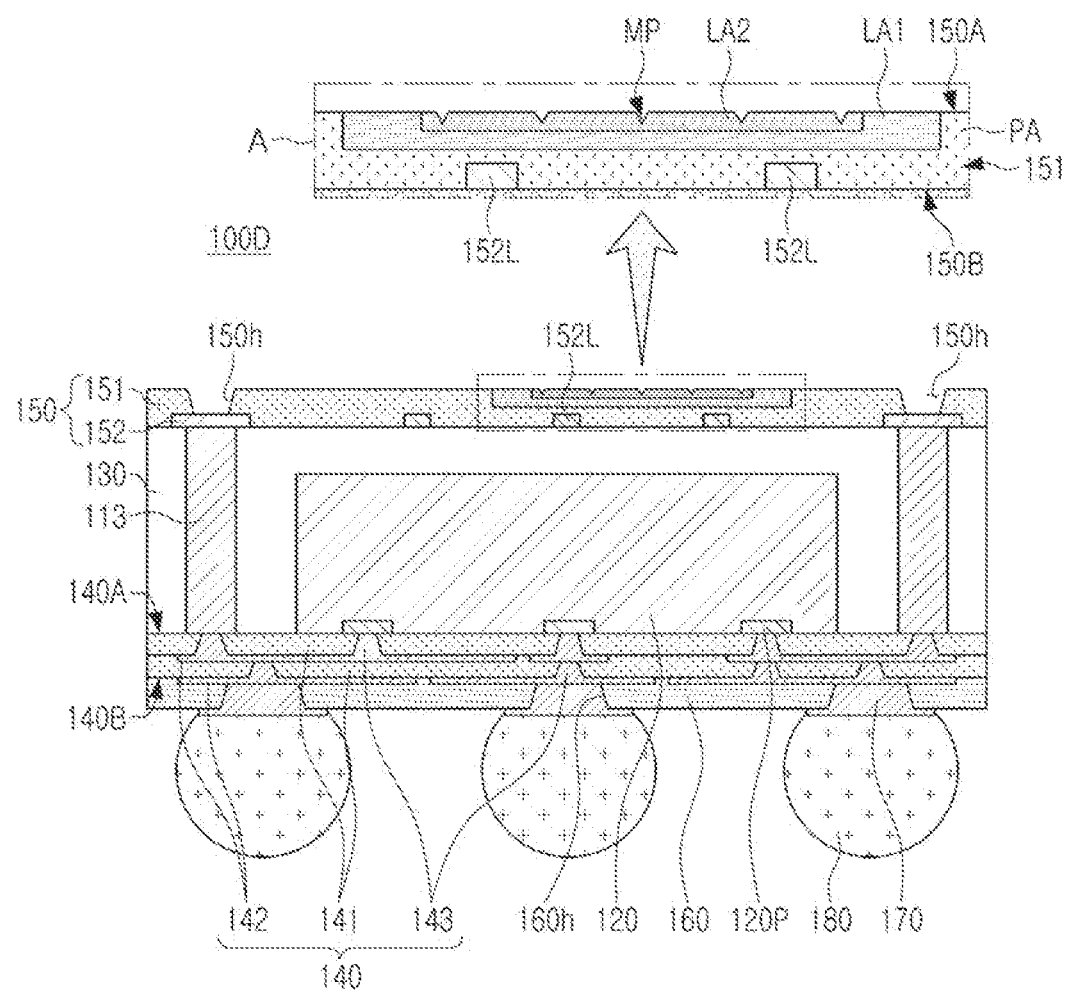
FIG. 6 is a cross-sectional view illustrating a semiconductor package according to example embodiments.

FIG. 6 is a cross-sectional view illustrating a semiconductor package according to example embodiments.

Referring to FIG. 6, a semiconductor package 100D may be understood to be similar to the structure illustrated in FIGS. 1 to 5, except that a frame is not included, and thus, the shape of a second connection structure 150 and the location of a marking pattern MP are different therefrom.

In the semiconductor package 100D, a vertical connection structure 113 may be connected to a first redistribution layer 142 of a first connection structure 140 without a frame structure, and may have a shape extending in the vertical direction. The vertical connection structure 113 may provide an electrical connection path passing by the semiconductor chip 120 in a vertical direction. The side surface of the vertical connection structure 113 may be surrounded by an encapsulant 130. The encapsulant 130 may not include an insulating layer, and may only be formed of a region encapsulating the semiconductor chip 120. A second redistribution layer 152 may be formed on the encapsulant 130 and connected to the vertical connection structure 113. As described above, the second insulating layer 151 may include a transparent or translucent insulating material, and a discolored area LA1, a marking area LA2, and a peripheral area PA may be disposed in the surface of the second insulating layer 151, and the marking pattern MP may be disposed in the marking area LA2.

Figure 7:
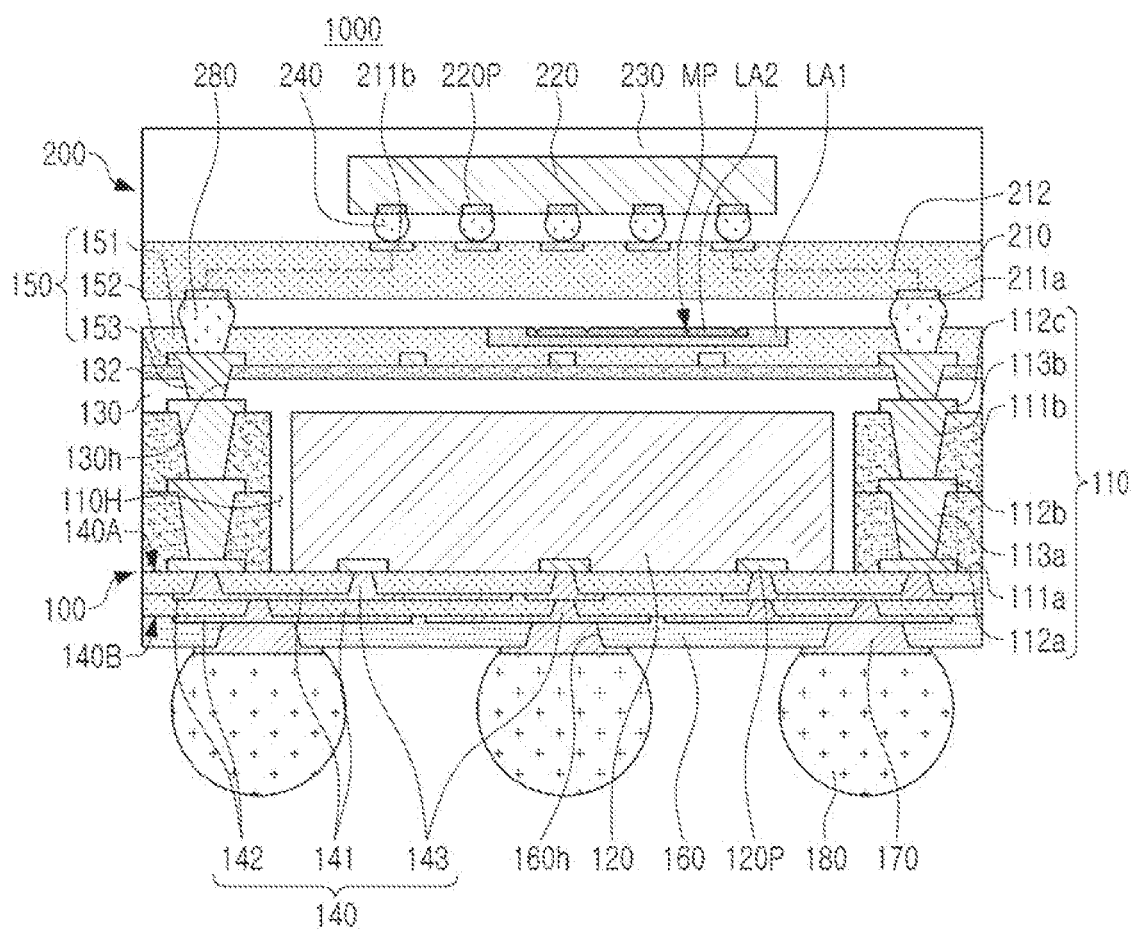
FIG. 7 is a cross-sectional view illustrating a semiconductor package according to example embodiments.

FIG. 7 is a cross-sectional view illustrating a semiconductor package according to example embodiments.

Referring to FIG. 7, a semiconductor package 1000 may include a first package 100 and a second package 200 coupled to an upper portion of the first package 100. The first package 100 may be one of the semiconductor packages illustrated in FIGS. 1, 4, 5 and 6.

The second package 200 may include a redistribution substrate 210, a second semiconductor chip 220, and a second encapsulant 230. The redistribution substrate 210 may include redistribution pads 211a and 211b which may be electrically externally connected and disposed on a lower surface and an upper surface of the redistribution substrate 210, respectively. In addition, the redistribution substrate 210 may include a redistribution circuit 212 therein, connected to the redistribution pads 211a and 211b. The redistribution circuit 212 may redistribute a connection pad 220P of the second semiconductor chip 220 to the fan-out region.

The second semiconductor chip 220 includes one or more connection pads 220P connected to an internal integrated circuit, and the connection pad 220P may be electrically connected to the redistribution substrate 210 through a connection member 240. The connection member 240 may include a conductive bump or a conductive wire. For example, the connection member 240 may be a solder ball. The second semiconductor chip 220 is disposed on the redistribution substrate 210 and may be electrically connected to the redistribution pads 211a and 211b and the redistribution circuit 212. In a modified example, the connection pad 220P of the second semiconductor chip 220 may directly contact the upper surface of the redistribution substrate 210 and may be electrically connected to the redistribution circuit 212 through a via inside of the redistribution substrate 210.

The second encapsulant 230 may include a material that is the same as or similar to a first encapsulant 130 of the first package 100. The second package 200 may be physically and electrically connected to the first package 100 by a metal bump 280. The metal bump 280 may be electrically connected to the redistribution circuit 212 inside of the redistribution substrate 210 through the redistribution pad 211a on the lower surface of the redistribution substrate 210. The metal bump 280 may be formed of a low melting point metal, for example, tin (Sn) or an alloy including tin (Sn).

Figure 8:
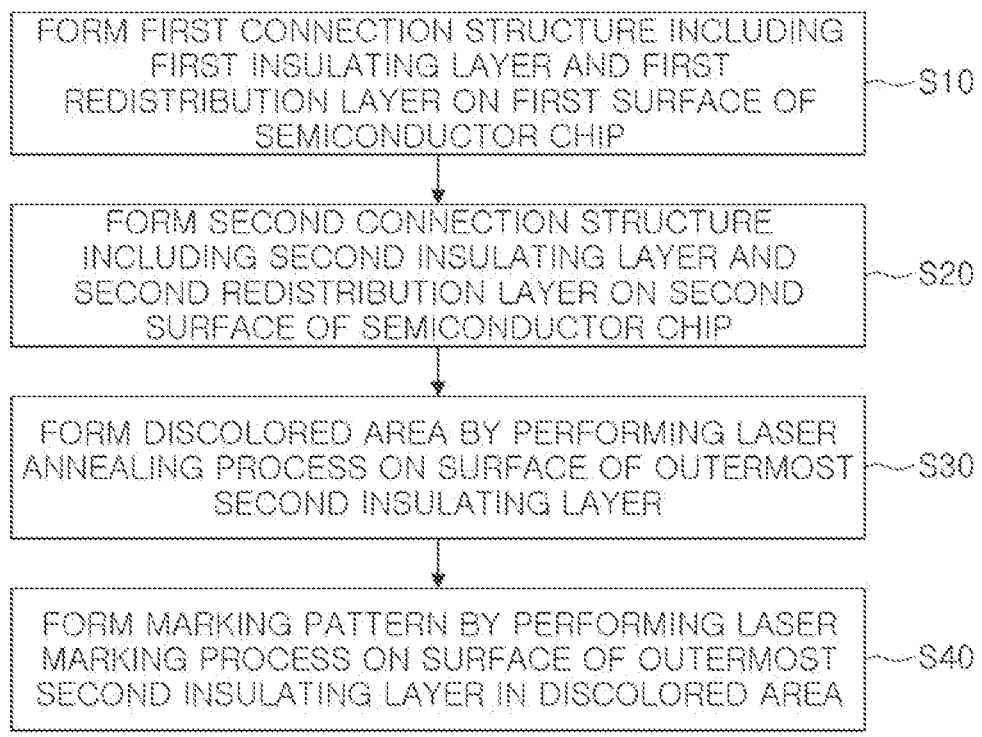
FIG. 8 is a flowchart illustrating a method of manufacturing a semiconductor package according to example embodiments.

FIG. 8 is a flowchart illustrating a method of manufacturing a semiconductor package according to example embodiments.

Figure 9:
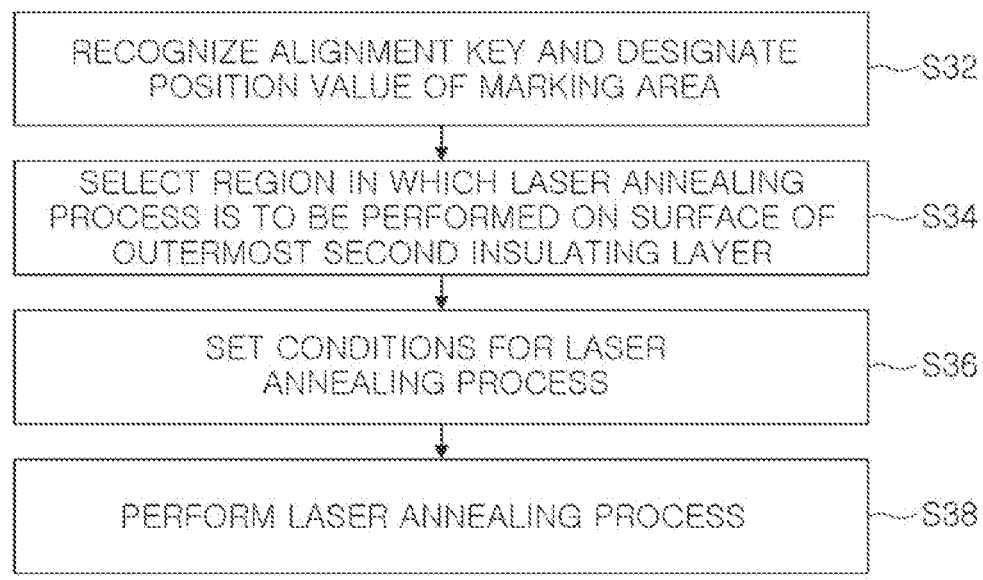
FIG. 9 is a flowchart illustrating a method of forming a discolored area of a semiconductor package according to example embodiments.

FIG. 9 is a flowchart illustrating a method of forming a discolored area of a semiconductor package according to example embodiments.

FIGS. 10A to 12B are diagrams illustrating a process sequence to illustrate a method of manufacturing a semiconductor package according to example embodiments.

Figure 10A:
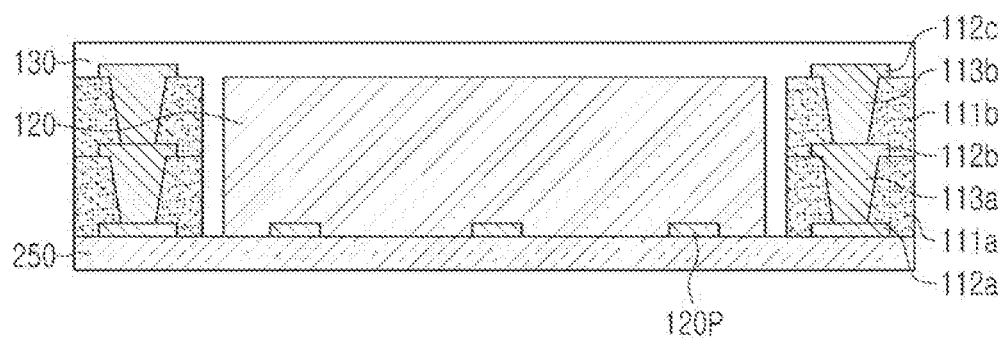
FIGS. 10A to 12B are diagrams illustrating a process sequence illustrating a method of manufacturing a semiconductor package according to example embodiments.
Figure 10B:
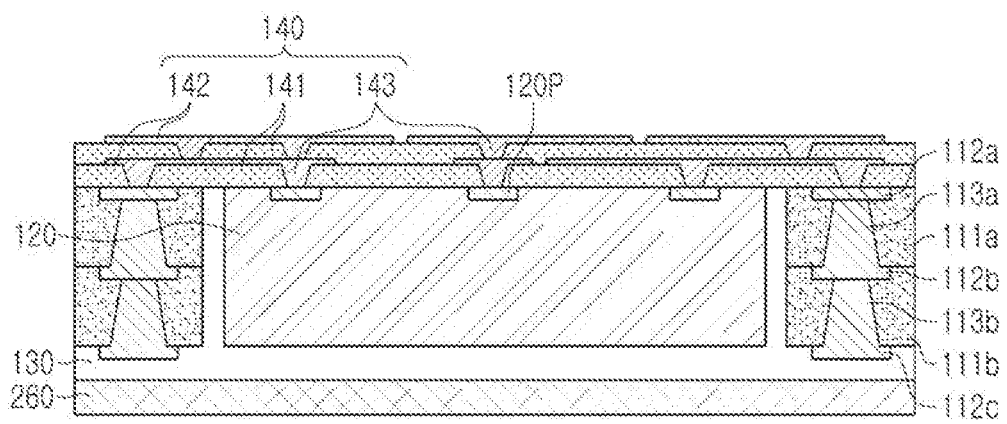

Referring to FIGS. 8, 10A and 10B, a first connection structure 140 including a first insulating layer 141 and a first redistribution layer 142 may be formed on a first surface of a semiconductor chip 120 (S10).

First, a frame 110 including a semiconductor chip 120 and a through-hole 110H in which the semiconductor chip 120 is accommodated are disposed on a first adhesive film 250, and an encapsulant 130 may be formed to seal the semiconductor chip 120.

As described above, the frame 110 includes a wiring structure together with first and second insulating layers 111a and 111b, and the wiring structure may include wiring layers 112a, 112b, and 112c and wiring via layers 113a and 113b connecting the wiring layers 112a, 112b, and 112c. The first adhesive film 250 may be attached to the lower side of the first insulating layer 111a. The first adhesive film 250 may be a tape including an epoxy resin, or the like. The encapsulant 130 may extend to the upper surface of the frame 110 to cover third wiring layer 112c.

Next, after attaching a second adhesive film 260 to the upper surface of the encapsulant 130 and removing the first adhesive film, the first connection structure 140 may be formed on the removed surface as shown in FIG. 10B.

The first connection structure 140 may be formed by forming the insulating layer 141 using a lamination or coating method, forming a via hole in the insulating layer 141, and forming a first redistribution layer 142 and a first redistribution via 143 by electroplating or electroless plating. In the case of using the PID material as the insulating layer, the via hole may be formed with a fine pitch using a photolithography method.

Referring to FIGS. 8 and 10C to 10F, a second connection structure 150 including a second insulating layer 151 and a second redistribution layer 152 may be formed on a second surface of the semiconductor chip 120 (S20).

Figure 10C:
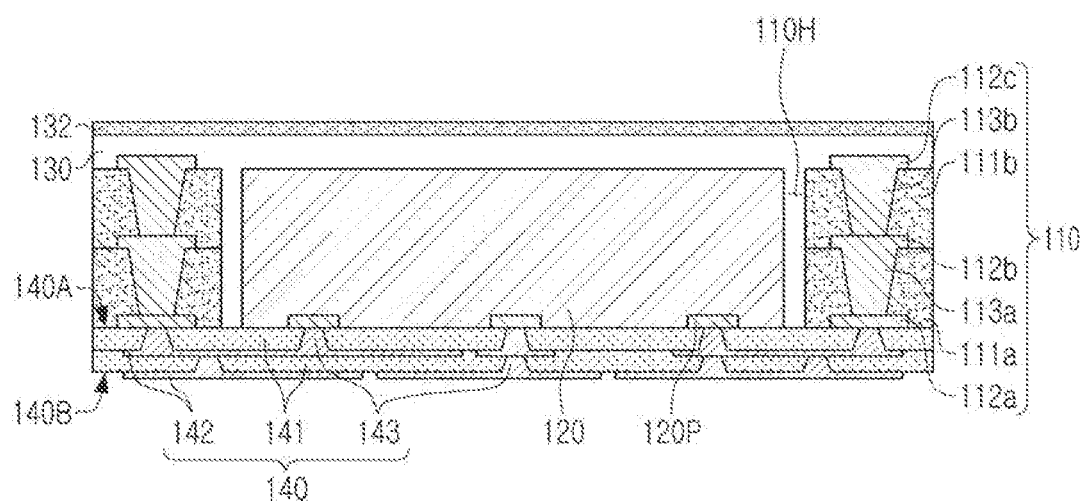

First, the second adhesive film 260 may be removed, and an insulating layer 132 may be formed on the encapsulant 130 as shown in FIG. 10C. The insulating layer 132 may be formed on the encapsulant 130 to implement a fine circuit of the second redistribution layers 152 and 152L. The insulating layer 132 may include an insulating material similar to the encapsulant 130, for example, may include a thermosetting resin such as an epoxy resin, a thermoplastic resin such as polyimide, or a prepreg, Ajinomoto Build-up Film (ABF), FR-4, or Bismaleimide Triazine (BT) or Epoxy Molding Compound (EMC) including an inorganic filler or/and glass fibers.

Figure 10D:
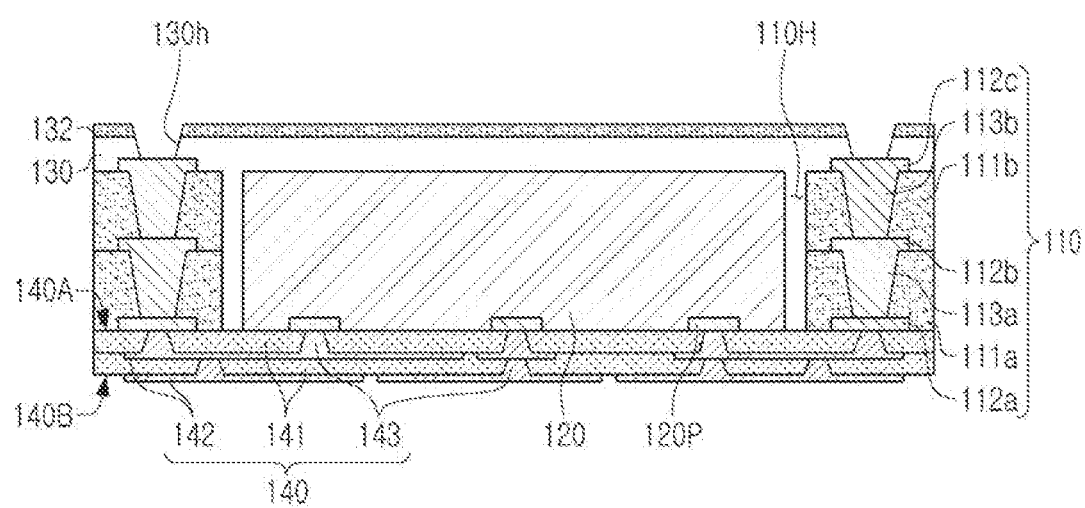

Next, an opening 130h exposing at least a portion of the third wiring layer 112c of the frame 110 is formed as shown in FIG. 10D, and a dry film is formed on the insulating layer 132, and may be selectively removed from a region in which the second redistribution layers 152 and 152L are to be formed, using a photolithography process.

Figure 10E:
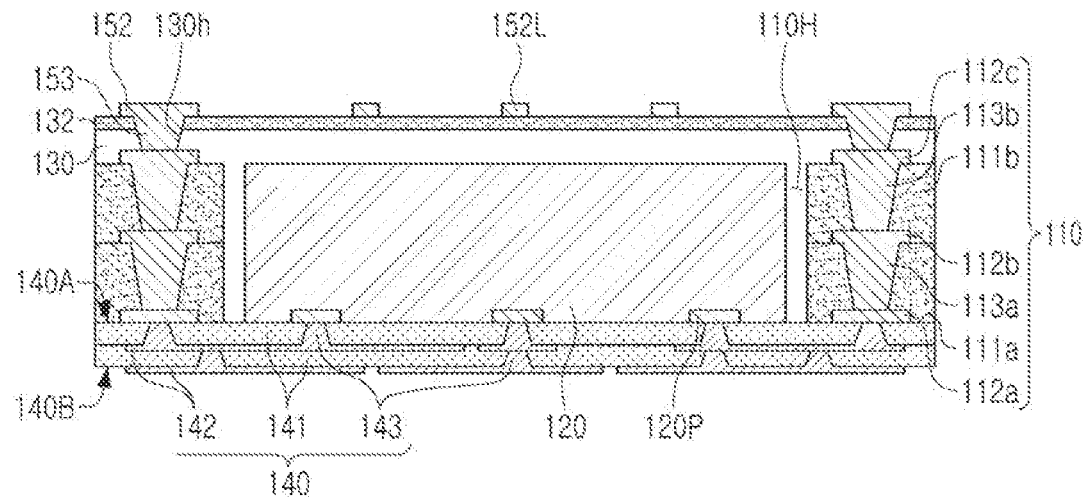

Next, a plating process may be performed using the patterned dry film, and the second redistribution layers 152 and 152L may be formed by removing the dry film as shown in FIG. 10E.

Figure 10F:
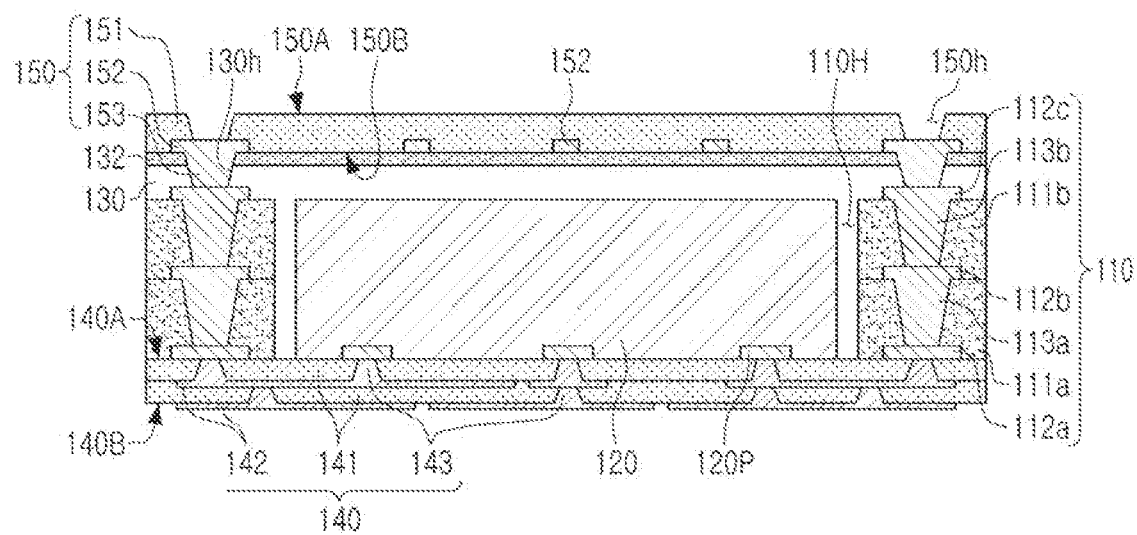

Next, after forming the second redistribution layers 152 and 152L, a first insulating layer 151 is formed to cover the second redistribution layers 152 and 152L and the insulating layer 132, and an opening 150h exposing at least a portion of the second redistribution layer 152 may be formed as shown in FIG. 10F.

Figure 11A:
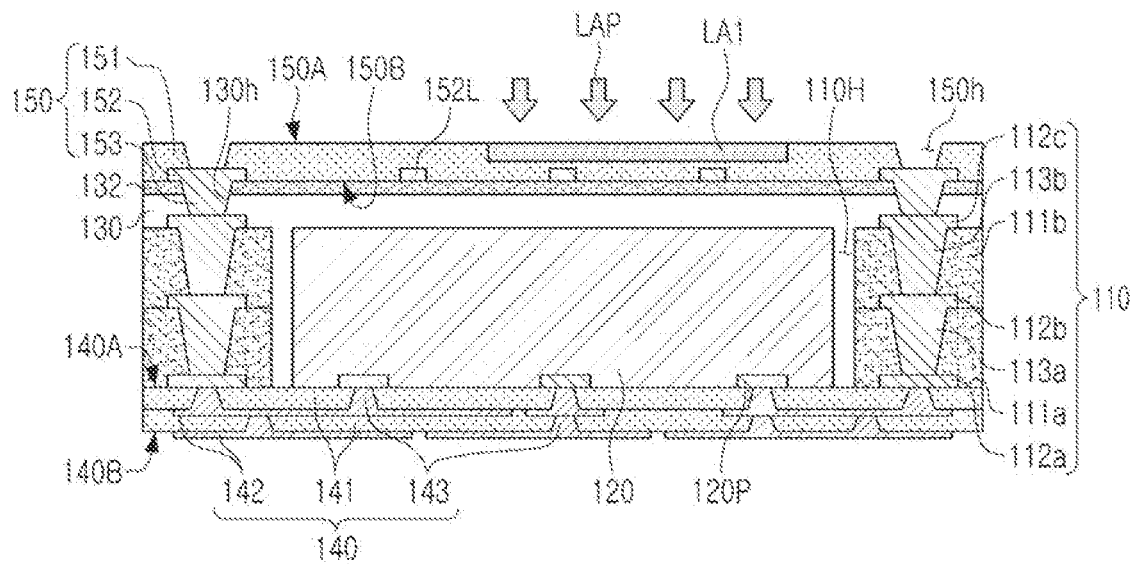
Figure 11B:
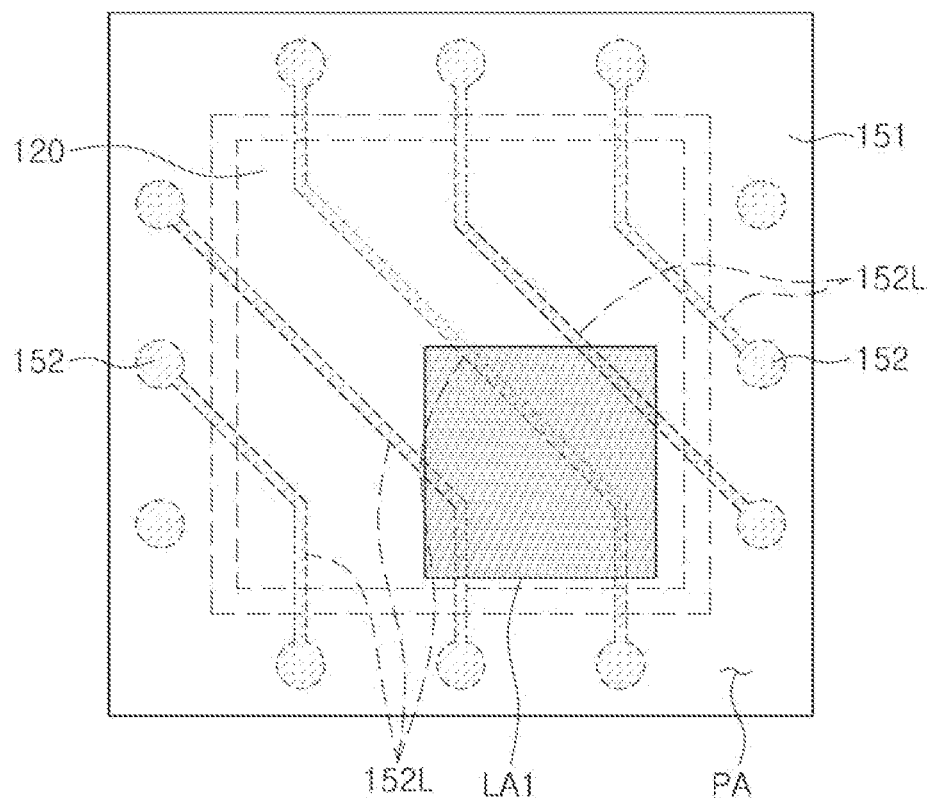

Referring to FIGS. 8, 9, 11A, and 11B, a discolored area LA1 may be formed by performing a laser annealing process (LAP) on the surface of an outermost second insulating layer 151 (S30). The discolored area LA1 having a color different from that of a transparent or translucent peripheral area PA may be formed in the second insulating layer 151 by the laser annealing process LAP as shown in FIGS. 11A and 11B. For example, by performing a laser annealing process LAP, the discolored area LA1 may be formed by changing the color of a partial area of the outermost second insulating layer 151.

The forming the discolored area LA1 (S30) may include recognizing an alignment key and designating a position value of a marking area (S32), selecting a region in which the laser annealing process (LAP) is to be performed on the surface of the outermost second insulating layer 151 (S34), setting conditions for the laser annealing process (LAP) (S36), and performing the laser annealing process (LAP) (S38).

The alignment key formed on the surface of the semiconductor chip 120 may be first recognized, and based thereon, a position value of a marking area in which a marking pattern is to be formed on the surface of a semiconductor package including the semiconductor chip 120 may be designated.

In the operation S34 of selecting a region in which the laser annealing process LAP is to be performed, a region in which the laser annealing process LAP is to be performed may be selected to have an area larger than the area of the marking area to be formed by a subsequent process.

Figure 12A:
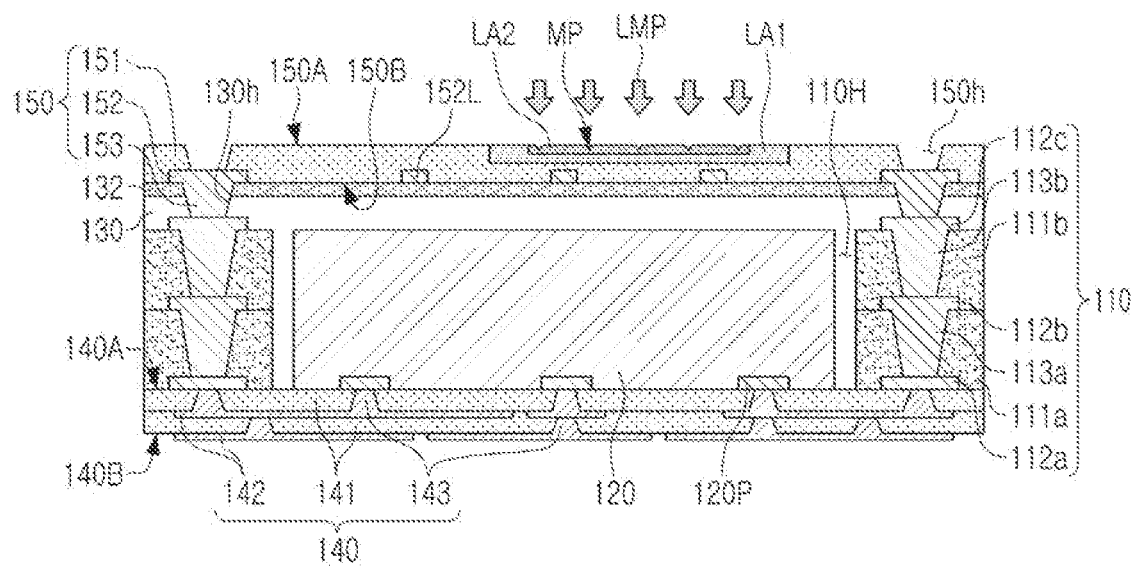
Figure 12B:
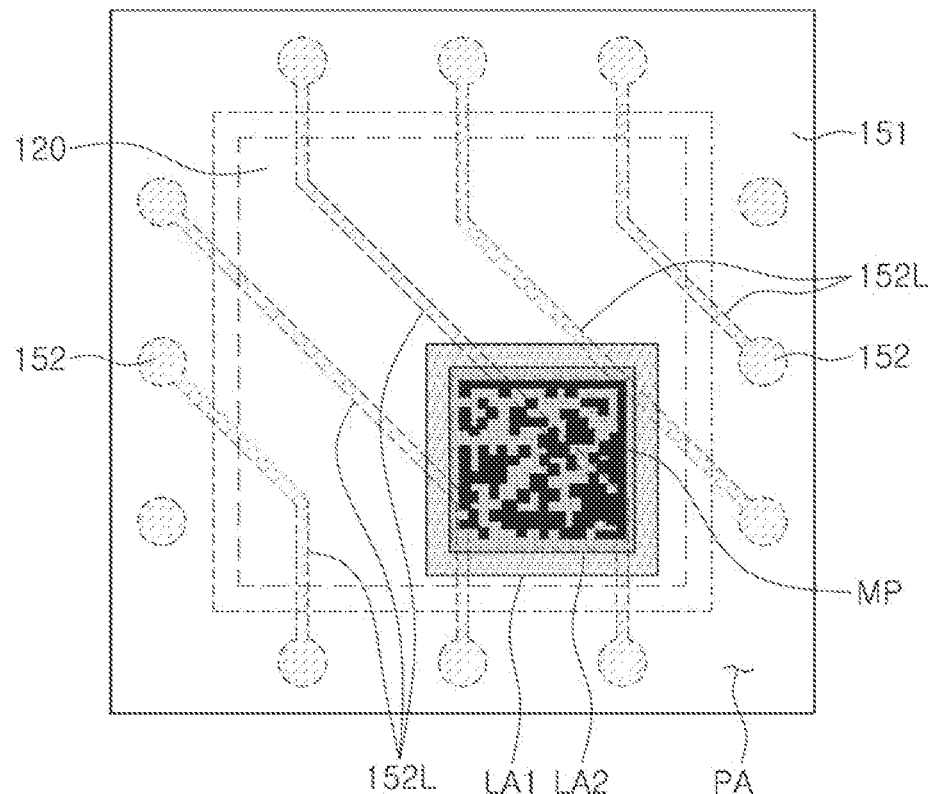

In the operation S36 of setting at least one condition of the laser annealing process (LAP), the conditions of the laser annealing process (LAP) may be set according to the insulating material of the second insulating layer 151. In the laser annealing process (LAP), various process conditions such as the size of the laser beam, the wavelength or energy of the laser beam, the number of processing, the spot size of the laser beam, and the overlap rate may be set. Based on the set condition value, the discolored area LA1 may be formed by performing the laser annealing process (LAP). In this operation, the laser annealing process LAP may be additionally performed to form a marking area LA2 as shown in FIGS. 12A and 12B. In an example embodiment, the first discolored areas LA11 and the second discolored area LA12 may also be formed by repeatedly performing the laser annealing process LAP.

In an example embodiment, a light source of a laser beam of a laser annealing process (LAP) may have a wavelength ranging from about 300 nm to about 360 nm. The laser beam may be, for example, a laser of a diode pumped solid state (DPSS) line having a wavelength of about 343 nm, a laser of an Eximer line having a wavelength of about 308 nm, or a laser of a normal spot having a wavelength of about 355 nm. The light source of the laser beam may be a light source having a wavelength of less than about 10% transmittance through the second insulating layer 151 without carbonizing the second insulating layer 151 by the laser annealing process (LAP) and without damage to the second redistribution layers 152 and 152L below the second insulating layer 151. However, this is an example, and the wavelength of the light source of the laser beam may be selected according to the type of material forming the second insulating layer 151 of a transparent or translucent material. In an example embodiment, the laser beam of the laser annealing process (LAP) may have various shapes such as a spot beam or a line beam.

Referring to FIGS. 8, 9, 12A and 12B, a marking pattern MP may be formed by performing a laser marking process (LMP) on the surface of the outermost second insulating layer 151, in the discolored area LA1 (S40).

The marking pattern MP may be formed in the marking area LA2. As illustrated in FIG. 12B, the marking pattern MP may be implemented as a two-dimensional barcode, and unlike the illustration, the marking pattern MP may also be implemented as symbols, numbers, characters, or the like. The marking pattern MP is formed in the discolored area LA1 and the marking area LA2, thereby significantly reducing transparency of the second redistribution layers 152 and 152L below the second insulating layer 151 and thus securing visibility of the marking pattern MP.

Next, referring to FIG. 1, the semiconductor package 100A of FIG. 1 may be manufactured by forming a passivation layer 160, an underbump metal layer 170, and a metal bump 180. Thereafter, the semiconductor package 1000 of FIG. 7 may be manufactured by combining the second package 200 on the first package 100 including the semiconductor package 100A.

As set forth above, according to an example embodiment, a semiconductor package including a marking pattern with improved visibility by disposing a discolored area in an insulating layer of a semiconductor package and disposing the marking pattern in the discolored area may be provided.

While example embodiments have been illustrated and described above, it will be apparent to those skilled in the art that modifications and variations could be made without departing from the scope of the disclosure as defined by the appended claims.

What is claimed is:

1. A semiconductor package comprising:
a first semiconductor chip;
an encapsulant covering at least a portion of the first semiconductor chip;
insulating layers provided on the encapsulant, each of the insulating layers being transparent or translucent; and
wiring layers provided on the encapsulant, the wiring layers being partially covered by the insulating layers,
wherein an outermost insulating layer of the insulating layers comprises a first region and a second region,
wherein a color of the first region is different from a color of the second region,
wherein the second region surrounds the first region, and
wherein at least one marking pattern comprising at least one step portion is provided in the first region of the outermost insulating layer.

2. The semiconductor package of claim 1, wherein a visible light transmittance of the first region is different from a visible light transmittance of the second region.

3. The semiconductor package of claim 1, wherein each of the insulating layers comprises a thermosetting material layer.

4. The semiconductor package of claim 1, wherein each of the insulating layers comprises a photoimageable dielectric material layer.

5. The semiconductor package of claim 1, wherein the wiring layers comprise a circuit line provided between the encapsulant and the insulating layers, and
wherein the at least one marking pattern overlaps the circuit line in a vertical direction.

6. The semiconductor package of claim 1, wherein the outermost insulating layer further comprises a third region having an area smaller than an area of the first region,
wherein a color of the third region is different from the color of the first region, and
wherein the at least one marking pattern is provided in the third region.

7. The semiconductor package of claim 6, wherein a visible light transmittance of the first region is lower than a visible light transmittance of the second region, and
wherein a visible light transmittance of the third region is lower than the visible light transmittance of the first region.

8. The semiconductor package of claim 6, wherein the first region of the outermost insulating layer comprises a first discolored area and a second discolored area,
wherein a color of the first discolored area is different from a color of the second discolored area,
wherein the first discolored area surrounds the second discolored area, and
wherein the second discolored area surrounds the third region.

9. The semiconductor package of claim 1, wherein an upper surface of the first region is at a level lower than an upper surface of the second region.

10. The semiconductor package of claim 1, wherein the first semiconductor chip comprises connection pads, and wherein the semiconductor package further comprises:

a connection structure provided below the first semiconductor chip, the connection structure comprising redistribution layers and redistribution vias electrically connected to the connection pads; and
metal bumps provided below the connection structure and electrically connected to the redistribution layers.

11. The semiconductor package of claim 10, further comprising a vertical connection structure penetrating through the encapsulant and connecting the redistribution layers to the wiring layers.

12. The semiconductor package of claim 1, further comprising a frame having a through-hole accommodating the first semiconductor chip,
wherein the frame comprises at least one core insulating layer, wiring vias provided in the at least one core insulating layer, and frame wiring layers electrically connected to each other by the wiring vias.

13. A semiconductor package comprising:
a frame having a through-hole and comprising a wiring structure connecting a first surface of the frame to a second surface of the frame opposite to the first surface;
a first connection structure provided on the second surface of the frame, the first connection structure comprising first redistribution layers electrically connected to the wiring structure and first insulating layers covering a portion of the first redistribution layers;
a semiconductor chip provided on the first connection structure in the through-hole, the semiconductor chip comprising a connection pad electrically connected to a first redistribution layer of the first redistribution layers;
an encapsulant encapsulating the semiconductor chip and extending to cover the first surface of the frame; and
a second connection structure provided on the first surface of the frame and the encapsulant, the second connection structure comprising second redistribution layers electrically connected to the wiring structure and second insulating layers covering a portion of the second redistribution layers,
wherein each of the second insulating layers comprises a photoimageable dielectric material layer,
wherein an outermost second insulating layer of the second insulating layers comprises a first region and a second region,
wherein a color of the first region is different from a color of the second region,
wherein the second region surrounds the first region, and
wherein at least one marking pattern comprising at least one step portion is provided in the first region of the outermost second insulating layer.

14. The semiconductor package of claim 13, wherein a visible light transmittance of the first region is different from a visible light transmittance of the second region.

15. The semiconductor package of claim 13, wherein each of the second insulating layers comprises a transparent or translucent material.

16. The semiconductor package of claim 13, wherein the outermost second insulating layer further comprises a third region overlapping the first region,
wherein a color is different from the color of the first region, and
wherein the at least one marking pattern is provided in the third region.

17. A semiconductor package comprising:
a semiconductor chip;
an encapsulant covering at least a portion of the semiconductor chip;

an insulating layer provided on the encapsulant, the insulating layer being transparent or translucent; and a wiring layer provided between the semiconductor chip and the insulating layer, wherein the insulating layer comprises a first region and a second region, wherein a visible light transmittance of an insulating material of the first region is different from a visible light transmittance of an insulating material of the second region, wherein the second region surrounds the first region, wherein the first region comprises a portion overlapping the wiring layer in a vertical direction, and wherein at least one marking pattern comprising at least one step portion is provided in the first region of the insulating layer.

18. The semiconductor package of claim 17, wherein the insulating layer comprises a thermosetting material layer.

19. The semiconductor package of claim 17, wherein the insulating layer comprises a photoimageable dielectric material layer.

20. The semiconductor package of claim 17, wherein the insulating layer has openings in the second region exposing a portion of the wiring layer, and wherein the openings are not provided in the first region.

* * * * *